United States Patent
Yamakawa et al.

(10) Patent No.: US 7,556,747 B2
(45) Date of Patent: Jul. 7, 2009

(54) ELECTRICALLY CONDUCTIVE PASTES

(75) Inventors: Masahiro Yamakawa, Osaka (JP); Kohei Shimoda, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 450 days.

(21) Appl. No.: 10/531,697

(22) PCT Filed: Jul. 13, 2004

(86) PCT No.: PCT/JP2004/010286

§ 371 (c)(1),
(2), (4) Date: Apr. 18, 2005

(87) PCT Pub. No.: WO2005/015573

PCT Pub. Date: Feb. 17, 2005

(65) Prior Publication Data

US 2006/0022173 A1 Feb. 2, 2006

(30) Foreign Application Priority Data

Aug. 8, 2003 (JP) ............................... 2003-289607

(51) Int. Cl.
*H01B 1/22* (2006.01)
(52) U.S. Cl. ...................................... 252/512; 252/514
(58) Field of Classification Search ................ 252/512, 252/514; 106/1.18, 1.2; 75/255
See application file for complete search history.

(56) References Cited

U.S. PATENT DOCUMENTS 4,406,701 A   9/1983  Yamaoka et al.
4,624,865 A  11/1986  Gindrup et al.

(Continued)

FOREIGN PATENT DOCUMENTS

EP          0 123 823       11/1984

(Continued)

OTHER PUBLICATIONS

European Search Report for Corresponding European Application, issued Nov. 18, 2005.

*Primary Examiner*—Mark Kopec
(74) *Attorney, Agent, or Firm*—McDermott Will & Emery LLP

(57) ABSTRACT

Provided is a conductive paste which can have high conductivity even if the sintering temperature is 500° C. or less, and which does not cause an interference pattern or crack on a substrate even if a thick film thereof is formed on the substrate. The conductive paste comprises main components including a metal powder, a glass frit, and an organic vehicle. The metal powder is composed of spherical particles (A) having an average primary-particle diameter of 0.1 to 1 μm and spherical particles (B) having an average primary-particle diameter of 50 nm or less, and the content of spherical particles (A) ranges from 50 to 99 wt % and the content of spherical particles (B) ranges from 1 to 50 wt %. The content of the glass frit ranges from 0.1 wt % to 15 wt % to the total amount of the glass frit and the metal powder. Preferably, the glass frit does not contain lead and has a working point of 500° C. or less, and the average particle diameter thereof is 2 μm or less. The present invention can widely be applied to print on a substrate and sinter so as to form an electric circuit on the substrate.

9 Claims, 1 Drawing Sheet

U.S. PATENT DOCUMENTS

| | | | |
|---|---|---|---|
| 5,229,037 A | | 7/1993 | Nakano et al. |
| 5,328,756 A | | 7/1994 | Wright et al. |
| 5,403,873 A | | 4/1995 | Nakamura et al. |
| 5,468,695 A | * | 11/1995 | Carroll et al. ............... 501/79 |
| 6,309,563 B1 | * | 10/2001 | Iino et al. ................... 252/514 |
| 7,115,218 B2 | * | 10/2006 | Kydd et al. ................. 252/512 |
| 7,160,487 B2 | * | 1/2007 | Miura ........................ 252/500 |
| 2004/0004209 A1 | * | 1/2004 | Matsuba et al. ........ 252/518.1 |

FOREIGN PATENT DOCUMENTS

| EP | 0 428 165 A1 | | 5/1991 |
|---|---|---|---|
| JP | 04-039812 | | 2/1992 |
| JP | 04-277406 | | 10/1992 |
| JP | 08-306228 | | 11/1996 |
| JP | 10-106346 | | 4/1998 |
| JP | 11-339554 | | 12/1999 |
| JP | 2003-132735 | | 5/2003 |
| JP | 2004-139838 | | 5/2004 |
| WO | WO 84/02423 | | 6/1984 |
| WO | WO 02/35554 A1 | * | 5/2002 |
| WO | WO 03/082983 A1 | | 10/2003 |

\* cited by examiner

ELECTRICALLY CONDUCTIVE PASTES

TECHNICAL FIELD

The present invention relates to conductive pastes that can widely be used to form electric circuits on insulated substrates by printing and sintering the pastes on the insulated substrates.

BACKGROUND ART

Conductive pastes are widely used in electronic components because electrode patterns can be formed by printing them. Nowadays, some of the printed patterns are sintered in order to decrease the electric resistance. Contact resistance between powdered metal particles in the conductive paste decreases due to the progress of sintering and thereby resulting printed patterns exhibit higher conductivity. A method is proposed in which an inorganic material such as glass is also added as a binder to achieve secure binding between the patterns and a substrate, and materials for the method are also proposed. For example, Patent Reference 1 discloses a conductive silver paste (conductive paste) composed of silver powder as a main component, $SiO_2$ powder, glass frit (PbO—$SiO_2$), and an organic vehicle. In Reference 1, it is stated that a film is formed by the addition of SiO2 powder during sintering, whereby plating resistance is improved.

As for a glass frit used in the conductive paste, in addition to the lead-containing glass frit described above, a lead-free glass frit is also used (Patent Reference 2). The glass frit is composed of $SiO_2$—$Al_2O_3$—$B_2O_3$—MgO—CaO, and have a softening point of 580° C. to 800° C.

Another Patent Reference describes individual components used in conductive pastes (Patent Reference 3). Reference 3 states that a precious metal powder is used as a metal powder and that the shape is preferably spherical, with a particle diameter of 0.1 to 3.0 μm. Glass powder described in this Reference contains well-known $SiO_2$, $Al_2O_3$, PbO, CaO, and $B_2O_3$ as main components, and has a softening point in the range of 450° C. to 650° C. The organic vehicle, which is used, by mixing with the powdered metal and a binder, as a dispersing agent for making the resulting conductive paste suitable for coating, usually contains a solvent, a resin, and an additive. According to the Reference, a preferable solvent is a combination of diethyl phthalate and terpineol, and a preferable resin is a combination of maleic acid resin, ethyl cellulose, and an acrylic resin. Fatty acid amide wax is indispensable for the additive.

Patent Reference 1: Japanese Unexamined Patent Application Publication No. 10-106346

Patent Reference 2: Japanese Patent No. 2941002

Patent Reference 3: Japanese Unexamined Patent Application Publication No. 2003-132735

DISCLOSURE OF INVENTION

As described in Patent References 1 to 3, conductive pastes to be sintered are generally composed of a precious metal powder, glass frit, and an organic vehicle. Although the characteristics of conductive pastes have been improved depending on the combination of such components so as to meet purposes of various uses, a shortcoming of known conductive pastes is that if sintering temperature is low, high conductivity cannot be achieved since they require a high sintering temperature (i.e. 500° C. or more) in order to increase their conductivity. When a substrate having low heat resistance, e.g. a glass substrate, is used, sintering must be performed at a low sintering temperature. Thus, there have been demands for conductive pastes in which high conductivity and a low sintering temperature are compatible. Though a thick film must be coated in order to decrease wiring resistance, the thick film increases the residual stress of the film. When a glass substrate or a dielectric layer-coated glass substrate is used as a base, interference fringes or cracks occur on the glass substrate or in the dielectric layer. Therefore, it has been difficult to increase the film thickness.

It is an object of the present invention to solve these problems by providing a conductive paste exhibiting high conductivity even if the sintering is performed at a low temperature. Another aspect of the present invention is to improve the processability of the paste, such as the formation of a thick film of paste.

A conductive paste according to the present invention contains a powdered metal, glass frit, and an organic vehicle as main components. The metal powder is composed of spherical particles (A) having an average primary-particle diameter of 0.1 to 1 μm and spherical particles (B) having an average primary-particle diameter of 50 nm or less. The content of spherical particles (A) ranges from 50 to 99 wt %, and the content of spherical particles (B) ranges from 1 to 50 wt %. Furthermore, the content of the glass frit ranges from 0.1 wt % to 15 wt % to the total amount of the glass frit and the metal powder. In order to achieve high conductivity, preferably fine particles of metal powder are aggregated densely. In the present invention, since gaps among particles (A) having a relatively large particle diameter are filled with particles (B) having a relatively small particle diameter, the packing density of the metal particles is high and the conductivity obtained by sintering at a low temperature is improved.

In particular, the metal powder preferably includes the spherical particles (A) by 90 to 97 wt % and spherical particles (B) by 3 to 10 wt % so that a high packing density and the effect of low-temperature sintering are sufficiently achieved, and thus the content of expensive spherical particles (B) is reduced, which is economical.

The metal powder according to the present invention may comprise particles of metal selected from the group consisting of a metal, an alloy, and a composite metal. Especially, the metal is preferably selected from the group consisting of platinum, gold, silver, copper, nickel, and palladium. Silver is more preferably used because of its high conductivity.

When the glass frit is lead-free and the metal powder is silver, the glass frit having a working point of 500° C. or less is preferable. The processability of the paste is improved because the lead-free glass frit can be treated at a relatively low temperature. Glass frit having a working point of 450° C. or less is more preferable.

Glass frit having a large particle diameter compared with that of the metal powder causes a decrease in dispersibility. Glass frit having an average particle diameter of 2 μm or less exhibits improved dispersibility in the paste, and enhances the aforesaid combination effect of metal powders.

Regarding the organic vehicle, a solution prepared by dissolving a cellulose resin, an acrylic resin, or the like in a solvent is preferable. The solvent is preferably noncorrosive to the substrate coated with paste, and the solvent having low volatility is suitable for achieving desirable printing processability. For example, in order to achieve excellent applicability during printing, it is preferable that an organic vehicle for screen printing be prepared by dissolving 10 to 20 wt % of ethyl cellulose having a molecular weight of 10,000 to 20,000 in butyl carbitol acetate or α-terpineol.

The metal particles in the conductive paste according to the present invention exhibits a high packing density after sintering. This particularly improves the conductivity. The combination of appropriate glass frit and an organic vehicle increases processability of the conductive paste. The coating applicability of thick film and screen-printing performance are also improved.

BEST MODE FOR CARRYING OUT THE INVENTION

Figure 1:
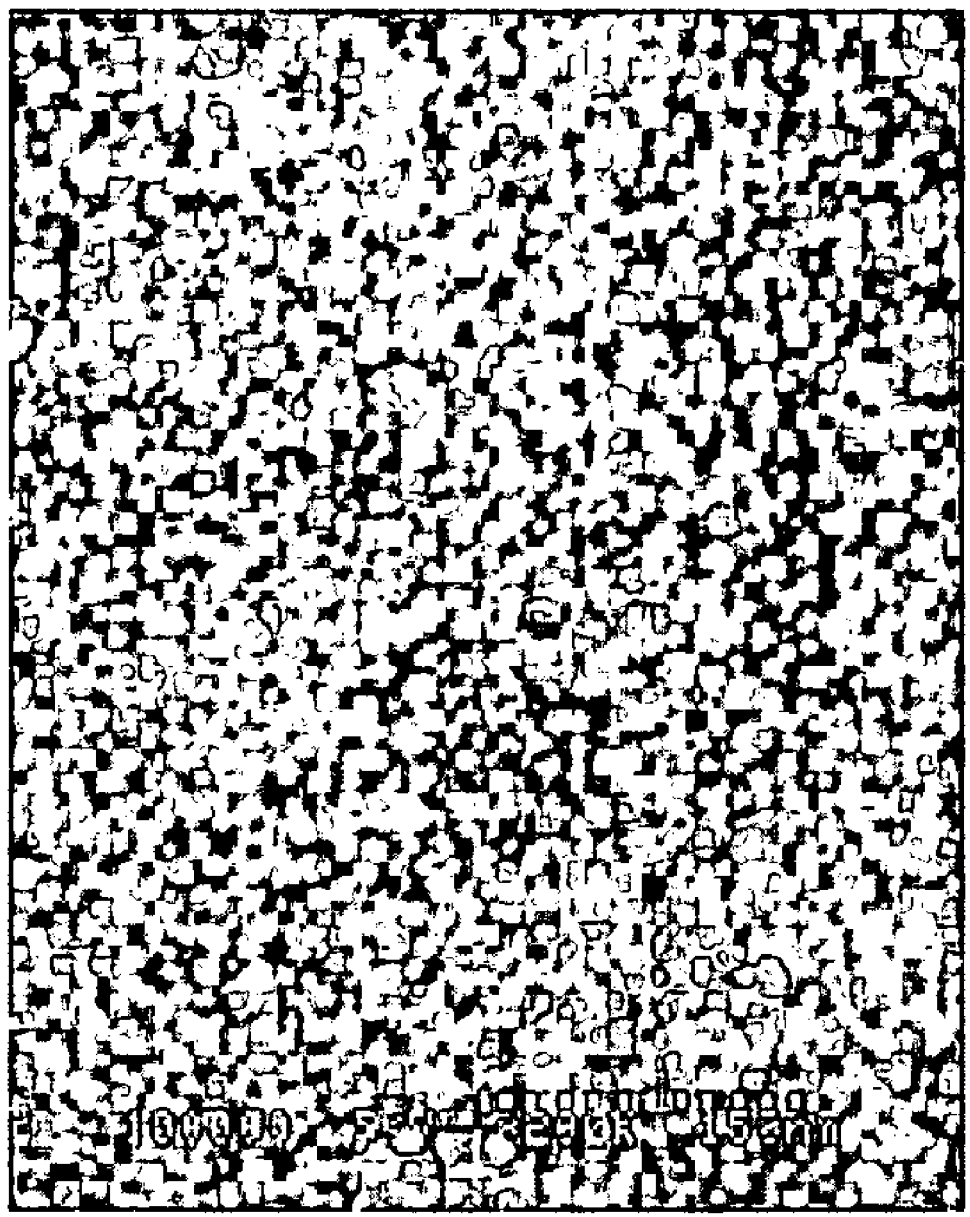
FIG. 1 is an electron micrograph of a silver powder used in the present invention, the primary particles thereof having an average particle diameter of 50 nm or less.

Metal powder used in the present invention includes two types, (A) and (B). The spherical particles (A) having an average primary particle diameter of 0.1 to 1 μm are commercially available, e.g. silver powder SPQ03S (average particle diameter: 0.5 μm, specific surface area: 1.40 m$^2$/g, tap density: 4.2 g/cm$^3$) by Mitsui Mining & Smelting Co., Ltd.

The spherical particles (B) having an average primary particle diameter of 50 nm or less can be prepared by wet reduction of a metallic compound. Specifically, a water-soluble metallic compound is added and dissolved in water or in a mixture of water and lower alcohol, and then a water solution containing a reducing agent and a surface-treatment agent is added, the resulting solution being stirred at a temperature of 30° C. or less. For example, in the case where the metal powder is a silver powder, the spherical particles (B) can be prepared as follows.

Silver nitrate is dissolved in a solvent made by mixing pure water and ethanol in equal amounts, and the resulting solution is adjusted to pH 11.3 with aqueous ammonia and made transparent. Then, the resulting solution is adjusted to pH 11.3 with aqueous ammonia so as to transparentize the solution. A reducing agent of L-ascorbic acid and a dispersing agent of polyacrylic acid are dissolved in another solution made by mixing pure water and ethanol in equal amounts, and while the resulting solution is maintained at 25° C., the silver nitrate solution, which is separately prepared as describe above, is gradually added dropwise to the solution with stirring in order to precipitate fine silver particles. Subsequently, they are washed and dried; thus, spherical silver particles (B) having an average primary particle diameter of 20 nm are obtained. Other fine metallic particles can be prepared by the same process as above using other metals.

Each of the spherical particles (A) and (B) prepared as above can be used alone in a conductive paste. The conductivity of a conductive paste based on a single use of the spherical particles (A) can be improved by increasing the sintering temperature. However, a low sintering temperature for achieving better processability causes a decrease in the conductivity. On the contrary, a conductive paste based on a single use of the spherical particles (B) can maintain almost the same conductivity as that of pure silver even if the sintering temperature is low. However, since this conductive paste using the spherical particles (B) without spherical particles (A) requires a large amount of the expensive spherical particles (B), it is uneconomical.

The present invention has been completed in order to decrease the sintering temperature from the viewpoint of processability, and also to achieve a sufficient conductivity and economy. Namely, two differently sized metal powders are mixed in predetermined proportions. When the content of the spherical particles (B) is less than 1 wt %, the spherical particles (B) cannot sufficiently surround the spherical particles (A). As a result, sintering at low temperature occurs at localized sites and conductive paths are not sufficiently generated during the sintering. Therefore, the resulting conductivity is almost the same as that of a conductive paste made of the spherical particles (A) alone. When the content of the spherical particles (B) is higher than 50 wt %, the spherical particles (B) completely surround the spherical particles (A), resulting in sufficient conductivity. However, the cost increases because a large amount of the spherical particles (B) are used. Consequently, it is preferable that the ratio of the spherical particles (A) range from 50 to 99 wt % and the ratio of the spherical particles (B) range from 1 to 50 wt %. Preferably, the ratio of the spherical particles (A) ranges from 90 to 97 wt % and the ratio of the spherical particles (B) ranges from 3 to 10 wt %. In such ratios, sintering at a low temperature can generate conductive pastes having sufficient conductivity, and the cost can be suppressed.

The glass frit can be selected from commercially available products. In consideration of the environment, lead-free glass frit is preferable. Bi-based glass frit does not contain lead and has a low working point of 500° C. or less, or a lower working point of 450° C. or less. Preferably, the Bi-based glass frit is composed of $Bi_2O_3$ containing slight amounts of other materials such as $B_2O_3$, e.g. "1100", "1100B" (Asahi Glass Company), and "BR10" (Nippon Frit Co., Ltd.).

The size of a glass frit used for a conductive paste may affect the conductivity since such glass frit generally has an average particle diameter of about 3 μm and a maximum particle diameter of about 50 μm and tends to segregate because the metal powder used in the conductive paste is fine. Therefore, the glass frit having an average particle diameter of 5 μm or less is suitable. Since the particle diameter of the glass frit varies, the maximum particle diameter of the glass frit is preferably 50 μm or less. A glass frit having an average particle diameter of 2 μm and a maximum particle diameter of 5 μm is more preferable because it barely segregates and shows excellent dispersibility, allowing high conductivity.

The glass frit can be used even at a low content. Preferably, the ratio of the amount of the glass frit to the total amount of the metal power and the glass frit ranges from about 0.1 to 15 wt % so as to provide the sufficient adhesion between the conductive paste and the substrate. When the content of the glass frit is less than 0.1 wt %, the adhesion between the conductive paste and the substrate decreases. However, a content of higher than 15 wt % results in low conductivity. When the content of glass frit ranges from 1 wt % to 15 wt %, the adhesion between the paste and the substrate is further enhanced. Such a ratio of the glass frit is more preferable.

When the conductive paste is used at a thickness of 25 μm or less, a glass frit content of 1 wt % or more does not cause problems. However, when the conductive paste is applied as a film having a thickness of 25 μm or more, the residual stress of the film increases during the sintering. As a result, when a glass substrate or a dielectric layer-coated glass substrate is used as a base, an interference pattern or crack occurs on the glass substrate or in the dielectric layer. Therefore, the ratio of the amount of glass frit to the total amount of the metal power and the glass frit is preferably in the range of 0.1 to 1 wt % to decrease the residual stress of the film and also to enhance both the applicability and adhesion of the thick film to the substrate.

The organic vehicle used in the present invention is required to have characteristics to maintain uniform mixing of the metal powder and the glass frit, to control uniform coating on the substrate by a screen printing process or the like, and to prevent blurring or bleeding of the printed patterns. To maintain these characteristics, organic vehicles are preferably prepared by dissolving a cellulose resin or an acrylic resin in a solvent. The solvent should be noncorrosive to the substrate coated with paste. A solvent having low volatility is preferable for printing processability. For example, when a narrow pattern having a line width of 200 μm or less is drawn by screen printing, the organic vehicle that is prepared by dissolving 10 to 20 wt % of ethyl cellulose having a molecular weight of 10,000 to 20,000 in butyl carbitol acetate or α-terpineol can be preferably used.

EXAMPLE

Examples according to the present invention will now be described, but the scope of the present invention is not limited to these examples.

Examples 1 to 6 and Comparative Examples 1 to 3

An organic vehicle solution having a resin content of 14 wt % was prepared by dissolving ethyl cellulose having a molecular weight of 18,000 in butyl carbitol acetate. A silver powder of a type and amount shown in Table I was added as a metal powder to the solution, and the resulting solution was mixed thoroughly using a rotary agitating deaerator. A glass frit of a type and amount shown in Table I was further added to the solution, with stirring being continued. After visual confirmation of the uniformity, the solution was applied to a three-roll mill in order to prepare a conductive paste. The resulting conductive pastes in all Examples 1 to 6 and Comparative Examples 1 to 3 did not show poor appearance in ordinary state.

Each conductive paste sample was applied as a film with a width of 50 mm and a length of 90 mm on a glass substrate (PD200 substrate; Asahi Glass Company). The resulting glass substrate was put into a thermostatic vessel and heated at 200° C. for 30 minutes to volatilize the solvent. Then, the glass substrate was heated in a furnace at a sintering temperature (450° C. or 500° C.) shown in Table I for 30 minutes. After the sintering, the film thickness and volume resistivity were measured to evaluate the conductivity. The film thickness was measured with a surface roughness tester (SURFCOM130A; Tokyo Seimitsu Co., Ltd.). The volume resistivity was measured with a low-resistivity meter (Loresta-GP; Mitsubishi Chemical Corporation) according to JISK7194.

Next, adhesion of the conductive pastes to the substrate was evaluated. The samples used for the conductivity evaluation were each incised at intervals of 1 mm in a gridiron pattern, and an adhesive tape was put on the top surface thereof for a peeling test. After the peeling test of ten times, the degree of peeling was observed (cross-cut adhesion test). The samples partially peeled at the cross-cut adhesion test were subjected to ten cycles of peeling test without the gridiron incision, and the degree of peeling was observed (tape adhesion test). The evaluation was done according to the following grading. Excellent: no peeling in the cross-cut adhesion test, Good: no peeling in the tape adhesion test, and Poor: peeling with an area ratio of 50% or more in the tape adhesion test. The characteristic properties of each film are shown in Table I.

TABLE I

| | | Example 1 | Example 2 | Example 3 | Example 4 | Example 5 | Example 6 | Comparative Example 1 | Comparative Example 2 | Comparative Example 3 |
|---|---|---|---|---|---|---|---|---|---|---|
| Composition | | | | | | | | | | |
| Organic vehicle 1 *1 | | 40 | 40 | 40 | 40 | 40 | 40 | 40 | 40 | 40 |
| Glass frit (free from lead) | Sample A *2 | — | — | — | 5 | — | — | — | — | — |
| | Sample B *3 | 5 | 5 | 5 | — | — | 15 | 5 | 0.5 | 15 |
| | Sample C *4 | — | — | — | — | 5 | — | — | — | — |
| Silver powder | Spherical particle (A) *5 | 90 | 70 | 50 | 90 | 90 | 81 | 95 | 94.5 | 85 |
| | Spherical particle (B) *6 | 5 | 25 | 45 | 5 | 5 | 4 | — | 5 | — |
| Characteristic properties | | | | | | | | | | |
| Resistivity (μΩ·cm) | Sintering temperature of 450° C. | 2.2 | 2.2 | 2.1 | 4.7 | 2.5 | 3.3 | 4.5 | 2.2 | 7.8 |
| | Sintering temperature of 500° C. | 2.1 | 2.0 | 2.1 | 2.2 | 2.1 | 2.8 | 4.0 | 2.0 | 7.2 |
| Adhesion with substrate | Sintering temperature of 450° C. | Excellent | Excellent | Excellent | Good | Excellent | Excellent | Excellent | Good | Excellent |
| | Sintering temperature of 500° C. | Excellent | Excellent | Excellent | Excellent | Excellent | Excellent | Excellent | Good | Excellent |

*1 Ethyl cellulose (MW; 18,000); 14 wt %, the balance being butyl carbitol acetate
*2 Average particle diameter; 1.5 μm, maximum particle diameter; 5 μm, working point; 475° C.
*3 Average particle diameter; 1.5 μm, maximum particle diameter; 5 μm, working point; 425° C.
*4 Average particle diameter; 3 μm, maximum particle diameter; 40 μm, working point; 425° C.
*5 Spherical, average diameter of primary particle; 0.5 μm
*6 Spherical, average diameter of primary particle; 20 nm As shown in Table I, the samples prepared at a sintering temperature of 500° C. exhibited a volume resistivity of 3 μΩ·cm or less in all Examples 1 to 6 and Comparative Example 2, exhibiting high conductivity. However, the samples in Comparative Examples 1 and 3, of which silver powder was spherical particles (A) alone, exhibited a volume resistivity of higher than 3 μΩ·cm, resulting in poor conductivity. Particularly, the samples in Comparative Example 3, which contained the glass frit at the maximum ratio of 15 wt %, exhibited a higher volume resistivity, resulting in decreased conductivity.

The samples in Example 4, which were prepared using a glass frit having a working point of 475° C., exhibited sufficient conductivity in the case of sintering at 500° C., but not in the case of sintering at 450° C.

The samples in Example 6, which contained the glass frit at the maximum ratio (15 wt %), exhibited slightly lower conductivity due to the higher glass content in the conductive material. However, sintering at 500° C. caused a volume resistivity of 3 μΩ·cm or less. Therefore, the glass frit content should be 15 wt % or less to achieve a desirable result.

The samples in Example 5 were prepared using glass frit having a larger size. The samples that were sintered at 500° C. exhibited sufficiently low volume resistivity, presumably as a result of sufficient flow of the glass. This suggested that this sintering temperature caused sufficient flowability. However, the samples that were sintered at 450° C. exhibited somewhat higher volume resistivity. This is supposed that glass particles having a substantially maximum particle size in the glass frit inhibited the silver particles from being sintered. Therefore, the glass frit having an average particle diameter of 2 μm or less is preferable. Among them, the glass frit having a maximum particle diameter of less than 5 μm is more preferable.

The samples in Comparative Example 2 that contained the glass frit at a low content (0.5 wt %) peeled in the cross-cut adhesion test, exhibiting poor adhesion. The samples in Example 4, which were prepared using glass frit having a working point of 475° C., caused no problem in the case of sintering at 500° C., but exhibited partial peeling in the case of sintering at 450° C. However, both of the samples can be practically used because neither samples exhibited peeling in the tape-adhesion test.

Examples 7 to 13 and Comparative Examples 4 to 6

An organic vehicle solution having a resin content of 14 wt % was prepared by dissolving ethyl cellulose having a molecular weight of 13,500 in α-terpineol. A silver powder having a type and amount shown in Tables II and III was added as a metal powder to the solution, and the resulting solution was mixed thoroughly using a rotary agitating deaerator. A glass fit having a type and amount shown in Tables II and III was further added to the solution, with stirring being continued. After visual confirmation of the uniformity, the solution was applied to a three-roll mill in order to prepare a conductive paste. The resulting conductive pastes in all Examples 7 to 13 and Comparative Examples 4 and 6 did not have poor appearance in an ordinary state.

Each conductive paste sample was coated over an area with a width of 50 mm and a length of 90 mm on a glass substrate (PD200 substrate; Asahi Glass Company). The resulting glass substrate was put into a thermostat and heated at 200° C. for 30 minutes to volatilize the solvent. Then, the glass substrate was heated in a furnace at a sintering temperature (450° C. or 500° C.) shown in Table II and III for 30 minutes. After the sintering, the film thickness and volume resistivity were measured to evaluate the conductivity. The film thickness was measured with a surface roughness tester (SURFCOM130A; Tokyo Seimitsu Co., Ltd.). The volume resistivity was measured with a low-resistivity meter (Loresta-GP; Mitsubishi Chemical Corporation) according to JISK7194.

Next, residual stress of the resulting film was measured from the diffraction intensity of the Ag (311) plane with an X-ray residual-stress analyzer using Cr—Kα X-rays excited at 30 kV and 20 mA by a $\sin^2 \Psi$ process (iso-inclination method). Young's modulus of 75,000 MPa and Poisson's ratio of 0.38 were used as constants. The states of the sintered glass substrate were inspected visually and with an optical microscope to evaluate the applicability of the thick film. The evaluation was done according to the following grading.

Good: no abnormality such as damage or cracking on the glass substrate, and

Poor: cohesion failure on the glass substrate due to residual stress of the paste.

Next, adhesion of the conductive pastes to the substrate was evaluated. The samples used for the conductivity evaluation were each incised at intervals of 1 mm in a gridiron pattern, and an adhesive tape was put on the top surface thereof for a peeling test. After the peeling test of ten times, the degree of peeling was observed (cross-cut adhesion test). The samples partially peeled at the cross-cut adhesion test were subjected to ten cycles of peeling test without the gridiron incision, and the degree of peeling was observed (tape adhesion test). The evaluation was done according to the following grading. Excellent: no peeling in the cross-cut adhesion test, Good: no peeling in the tape adhesion test, and Poor: peeling with an area ratio of 50% or more in the tape adhesion test. The characteristic properties of each film are shown in Tables II and III.

TABLE II

| | | Example 7 | | Example 8 | | Example 9 | | Example 10 | | Example 11 | | Example 12 | | Example 13 | |
|---|---|---|---|---|---|---|---|---|---|---|---|---|---|---|---|
| Composition | | | | | | | | | | | | | | | |
| | Organic vehicle 2 *7 | 30 | | 30 | | 30 | | 30 | | 30 | | 30 | | 30 | |
| Glass frit (free from lead) | Sample A *2 | — | | — | | — | | 1 | | 0.25 | | — | | — | |
| | Sample B *3 | 1 | | 0.5 | | 0.25 | | — | | — | | — | | — | |
| | Sample C *4 | — | | — | | — | | — | | — | | 1 | | 0.25 | |
| Silver powder | Spherical particle (A) *5 | 94 | | 94.5 | | 94.75 | | 94 | | 94.75 | | 94 | | 94.75 | |
| | Spherical particle (B) *6 | 5 | | 5 | | 5 | | 5 | | 5 | | 5 | | 5 | |
| Film thickness (μm) | | 15 | 20 | 30 | 20 | 40 | 20 | 40 | 15 | 20 | 30 | 20 | 40 | 15 | 20 |
| Characteristic properties | | | | | | | | | | | | | | | |
| Resistivity (μΩ · cm) | Sintering temperature of 450° C. | 2.2 | 2.2 | 2.3 | 2.2 | 2.3 | 2.1 | 2.3 | 4.9 | 4.9 | 5.3 | 5.0 | 5.3 | 2.5 | 2.7 |

TABLE II-continued

| | | | | | | | | | | | | | | | | | | |
|---|---|---|---|---|---|---|---|---|---|---|---|---|---|---|---|---|---|---|
| | Sintering temperature of 500° C. | 2.0 | 2.0 | 2.0 | 2.0 | 2.0 | 2.0 | 2.0 | 2.2 | 2.2 | 2.4 | 2.2 | 2.2 | 2.1 | 2.2 | 2.2 | 2.1 | 2.1 |
| Adhesion with substrate | Sintering temperature of 450° C. | E | E | E | G | G | G | G | E | E | E | G | G | E | E | E | G | G |
| | Sintering temperature of 500° C. | E | E | E | G | G | G | G | E | E | E | G | G | E | E | E | G | G |
| Residual stress of film (MPa) | Sintering temperature of 450° C. | 31 | 42 | 79 | 24 | 36 | 22 | 30 | 35 | 40 | 82 | 20 | 37 | 35 | 40 | 82 | 25 | 34 |
| | Sintering temperature of 500° C. | 41 | 74 | 109 | 37 | 60 | 35 | 55 | 48 | 67 | 114 | 41 | 56 | 48 | 67 | 114 | 39 | 51 |
| Glass substrate observation | Sintering temperature of 450° C. | G | G | P | G | G | G | G | G | G | P | G | G | G | G | P | G | G |
| | Sintering temperature of 500° C. | G | P | P | G | G | G | G | G | P | P | G | G | G | P | P | G | G |

E; Excellent, G; Good, P; Poor
*1 Ethyl cellulose (MW; 18,000); 14 wt %, the balance being butyl carbitol acetate
*2 Average particle diameter; 1.5 µm, maximum particle diameter; 5 µm, working point; 475° C.
*3 Average particle diameter; 1.5 µm, maximum particle diameter; 5 µm, working point; 425° C.
*4 Average particle diameter; 3 µm, maximum particle diameter; 40 µm, working point; 425° C.
*5 Spherical, average diameter of primary particle; 0.5 µm
*6 Spherical, average diameter of primary particle; 20 nm
*7 Ethyl cellulose (MW; 13,500); 14 wt %, the balance being α-terpineol

TABLE III

| | | Comparative Example 4 | | Comparative Example 5 | | Comparative Example 6 | |
|---|---|---|---|---|---|---|---|
| Composition | | | | | | | |
| | Organic vehicle 2 *7 | 30 | | 30 | | 30 | |
| Glass frit (free from lead) | Sample A *2 | — | | — | | — | |
| | Sample B *3 | 5 | | 5 | | 3 | |
| | Sample C *4 | — | | — | | — | |
| Silver powder | Spherical particle (A) *5 | 95 | | 90 | | 92 | |
| | Spherical particle (B) *6 | — | | 5 | | 5 | |
| | Film thickness (µm) | 10 | 15 | 10 | 15 | 10 | 15 |
| Characteristic properties | | | | | | | |
| Resistivity (µΩ · cm) | Sintering temperature of 450° C. | 4.5 | 4.9 | 2.2 | 2.4 | 2.2 | 2.2 |
| | Sintering temperature of 500° C. | 4.0 | 4.1 | 2.0 | 2.1 | 2.0 | 2.1 |
| Adhesion with substrate | Sintering temperature of 450° C. | E | E | E | E | E | E |
| | Sintering temperature of 500° C. | E | E | E | E | E | E |
| Residual stress of film (MPa) | Sintering temperature of 450° C. | 34 | 80 | 31 | 80 | 27 | 72 |
| | Sintering temperature of 500° C. | 55 | 137 | 52 | 118 | 48 | 108 |
| Glass substrate observation | Sintering temperature of 450° C. | G | P | G | P | G | P |
| | Sintering temperature of 500° C. | G | P | G | P | G | P |

E; Excellent, G; Good, P; Poor
*1 Ethyl cellulose (MW; 18,000); 14 wt %, the balance being butyl carbitol acetate
*2 Average particle diameter; 1.5 µm, maximum particle diameter; 5 µm, working point; 475° C.
*3 Average particle diameter; 1.5 µm, maximum particle diameter; 5 µm, working point; 425° C.
*4 Average particle diameter; 3 µm, maximum particle diameter; 40 µm, working point; 425° C.
*5 Spherical, average diameter of primary particle; 0.5 µm
*6 Spherical, average diameter of primary particle; 20 nm
*7 Ethyl cellulose (MW; 13,500); 14 wt %, the balance being α-terpineol As shown in Tables II and III, the samples that were prepared at a sintering temperature of 500° C. exhibited a volume resistivity of 3 μΩ·cm or less in all Examples 7 to 13 and Comparative Examples 5 and 6, exhibiting high conductivity. However, the samples in Comparative Example 4, of which silver powder was spherical particles (A) alone, exhibited a volume of resistivity larger than 3 μΩ·cm, resulting in poor conductivity. The samples in Examples 7 to 9, which contained glass frit having a working point of 425° C., were evaluated at variable glass frit contents from 1% to 0.25%. The samples in Example 7 in which the glass frit content was 1% exhibited good adhesion with the substrate. However, the samples coated with films having a thickness of 20 μm or more exhibited large residual stress of the film, resulting in damaging the glass substrates. On the contrary, the samples in Examples 8 and 9 in which the content of the glass frit was 0.5% or 0.25% exhibited no abnormality in the glass substrates even in the cases where the film thickness was increased up to 40 μm, thus allowing the application of a thick film.

The samples in Examples 10 and 11 in which a glass frit having a working point of 475° C. were contained at a content ratio of 1% or 0.25% were evaluated. As in the cases of Examples 7 to 9, the samples in Example 10 in which the content of the glass frit was 1% exhibited cohesion failure of the glass substrate, resulting in the failure of thick film application when the film thickness was increased to 20 μm or more. The samples that were sintered at 450° C. exhibited slightly large volume resistivity because of a higher working point of the glass frit.

The samples in Examples 12 and 13 contained the glass frit having a comparatively larger particle size. However, since the amounts of the glass frit in these samples were small compared with those of the samples in Example 5, the glass exhibited sufficient flow during the sintering at 450° C., resulting in good conductivity. Regarding the coating of a thick film, as in the results in Examples 7 to 11, the damage of the glass substrate occurred in the samples in Example 12 in which the content of the glass frit was 1 wt % when the film was applied with a thickness of 20 μm or more.

In the samples in Comparative Examples 4 to 6, which contained 5 wt % glass frit, cohesion failure occurred in the glass substrate even in the case of the film thickness being 15 μm, thus allowing the coating thickness of 10 μm or less.

INDUSTRIAL APPLICABILITY

As shown above, the conductive pastes according to the present invention can preferably be used in the fields that require particularly high conductivity. Specifically, the conductive pastes are particularly suitable for formation of electrodes and the like of flat panel displays.

The invention claimed is:

1. An electrically conductive paste to be sintered comprising main components including a metal powder, a glass frit, and an organic vehicle, wherein the metal powder comprises spherical particles (A) having an average primary-particle diameter of 0.1 to 1 μm and spherical particles (B) having an average primary-particle diameter of 50 nm or less, and the content of spherical particles (A) is in the range of 50 to 99 wt % and the content of spherical particles (B) is in the range of 1 to 50 wt % relative to the total amount of metal particles;
   the content of the glass frit is in the range of 0.1 wt % to 15 wt % to the total amount of the glass frit and the metal powder;
   the electrically conductive paste exhibits a volume resistivity of 3 μΩ·cm or less at a sintering temperature of 500° C.; and
   the organic vehicle contains a cellulose resin or an acrylic resin.

2. An electrically conductive paste according to claim 1, wherein the content of the glass frit is 0.1 wt % or more and less than 1 wt % relative to the total amount of the glass fit and the metal powder.

3. An electrically conductive paste according to claim 1, wherein the content of the glass frit ranges from 1 wt % to 15 wt % to the total amount of the glass frit and the metal powder.

4. An electrically conductive paste according to any one of claims 1 to 3 wherein the metal powder is composed of the spherical particles (A) of 90 to 97 wt % and the spherical particles (B) of 3 to 10 wt % relative to the total amount of metal particles.

5. An electrically conductive paste according to claim 1, wherein the metal powder is at least one metal or an alloy selected from the group consisting of platinum, gold, silver, copper, nickel, and palladium.

6. An electrically conductive paste according to claim 1, wherein the glass frit does not contain lead.

7. An electrically conductive paste according to claim 1, wherein the working point of the glass frit is 500° C. or less.

8. An electrically conductive paste according to claim 7, wherein the working point of the glass frit is 450° C. or less.

9. An electrically conductive paste according to claim 1, wherein the glass frit is a powder having an average particle diameter of 2 μm or less.

* * * * *